(12) United States Patent
Cheng

(10) Patent No.: US 9,812,540 B2
(45) Date of Patent: Nov. 7, 2017

(54) ENHANCED SWITCH DEVICE AND MANUFACTURING METHOD THEREFOR

(71) Applicant: Enkris Semiconductor, Inc., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 47 days.

(21) Appl. No.: 14/395,338

(22) PCT Filed: Mar. 29, 2013

(86) PCT No.: PCT/CN2013/073432
§ 371 (c)(1),
(2) Date: Oct. 17, 2014

(87) PCT Pub. No.: WO2013/155929
PCT Pub. Date: Oct. 24, 2013

(65) Prior Publication Data
US 2015/0053921 A1    Feb. 26, 2015

(30) Foreign Application Priority Data
Apr. 20, 2012 (CN) .......................... 2012 1 0118172

(51) Int. Cl.
*H01L 29/778* (2006.01)
*H01L 29/423* (2006.01)
(Continued)

(52) U.S. Cl.
CPC .... *H01L 29/4238* (2013.01); *H01L 21/28264* (2013.01); *H01L 29/401* (2013.01);
(Continued)

(58) Field of Classification Search
CPC ........... H01L 29/66462; H01L 29/2003; H01L 29/7786; H01L 29/1066; H01L 29/4232;
(Continued)

(56) References Cited

U.S. PATENT DOCUMENTS 7,576,373 B1 *  8/2009  Hikita ................. H01L 29/7787
                                                      257/192
7,851,881 B1 * 12/2010  Zhao ................... H01L 21/0495
                                                      257/155
(Continued)

FOREIGN PATENT DOCUMENTS

CN    1728349 A    2/2006
CN    1901144      1/2007
(Continued)

OTHER PUBLICATIONS

Supplementary European Search Report issued in Application No. EP 13 77 8876 dated Nov. 10, 2015.
(Continued)

*Primary Examiner* — Edward Chin
(74) *Attorney, Agent, or Firm* — Pearne & Gordon LLP

(57) ABSTRACT

An enhanced switch device and a manufacturing method therefor. The method comprises: providing a substrate, and forming a nitride transistor structure on the substrate; fabricating and forming a dielectric layer on the nitride transistor structure, on which a gate region is defined; forming a groove structure on the gate region; depositing a p-type semiconductor material in the groove; removing the p-type semiconductor material outside the gate region on the dielectric layer; etching the dielectric layer in another position than the gate region on the dielectric layer to form two ohmic contact regions; and forming a source electrode and a drain electrode on the two ohmic contact regions, respectively.

20 Claims, 22 Drawing Sheets

(51) Int. Cl.
*H01L 21/28* (2006.01)
*H01L 29/49* (2006.01)
*H01L 29/51* (2006.01)
*H01L 29/66* (2006.01)
*H01L 29/40* (2006.01)
*H01L 29/20* (2006.01)

(52) U.S. Cl.
CPC ........ *H01L 29/4925* (2013.01); *H01L 29/513* (2013.01); *H01L 29/517* (2013.01); *H01L 29/518* (2013.01); *H01L 29/66462* (2013.01); *H01L 29/7783* (2013.01); *H01L 29/2003* (2013.01); *H01L 29/49* (2013.01)

(58) Field of Classification Search
CPC ............... H01L 29/4236; H01L 29/432; H01L 29/7787; H01L 29/812
USPC ....... 257/194, E21.403, E29.246, 43, E29.1, 257/192, 195, 196, 197, 201, 20; 438/104
See application file for complete search history.

(56) References Cited

U.S. PATENT DOCUMENTS

| | | | | |
|---|---|---|---|---|
| 8,901,604 B2* | 12/2014 | Mishra | ................ | H01L 29/0619 257/170 |
| 2010/0155720 A1* | 6/2010 | Kaneko | ............... | H01L 29/2003 257/43 |
| 2010/0244018 A1* | 9/2010 | Kaneko | ............... | H01L 29/4232 257/43 |
| 2011/0121313 A1* | 5/2011 | Briere | ................ | H01L 29/2003 257/76 |

FOREIGN PATENT DOCUMENTS

| | | |
|---|---|---|
| CN | 1937246 A | 3/2007 |
| CN | 101009324 A | 8/2007 |
| CN | 101022128 A | 8/2007 |
| CN | 101136432 A | 3/2008 |
| CN | 101185158 A | 5/2008 |
| CN | 101789445 A | 7/2010 |
| CN | 102709321 A | 10/2012 |
| CN | 2103/073432 | 7/2013 |
| EP | 2 385 544 A2 | 11/2011 |

OTHER PUBLICATIONS

Office Action for Chinese application No. 201210118172.X dated Jul. 16, 2015.
Written Opinion for Singapore application No. 11201406749W dated Jun. 8, 2015.
V. Kumar et al. "recessed 0.25um gate AlGaN/GaN HEMTs on SIC with high gate-drain breakdown voltage using ICP-RIE" In: IEE 2001 Electronic Letters Online No. 20010995, Nov. 22, 2001, vol. 37. No. 24, pp. 1483-1485.
Akira Endough et al. " Non-Recessed-Gate Enhancement-Mode AlGaN/GaN High Electron Mobility Transistors with High RF Performance" In: Japanese Journal of Applied Physics, vol. 43, No. 4B, 2004. pp. 2255-2258.
Yong Cai et al., "High-Performance Enhancement-Mode AlGaN/GaN HEMTs Using Fluoride-Based Plasma Treatment" In: IEEE Electronic Device Letters, Vo. 26, No. 7, Jul. 2005.
International Search report for PCT/CN2103/073432 dated Jul. 4, 2013.
Office Action for CN 201210118172.X dated Aug. 15, 2016.

* cited by examiner

ENHANCED SWITCH DEVICE AND MANUFACTURING METHOD THEREFOR

This application is a National Stage application of PCT international application PCT/CN2013/073432, filed on Mar. 29, 2013 which claims priority to Chinese Patent Application No. 201210118172.X, entitled "ENHANCED SWITCH DEVICE AND MANUFACTURING METHOD THEREFOR", filed with the Chinese State Intellectual Property Office on Apr.20, 2012, both of which are incorporated by reference in their entirety herein.

FIELD

The present application relates to the field of microelectronic technology, and particularly to an enhancement mode switching device and a method for fabricating the enhancement mode switching device.

BACKGROUND

Gallium nitride, which is semiconductor material, has become a hot topic of research due to its properties such as a wide band gap, a high electron saturated drift velocity, a high breakdown field strength and good thermal conductivity. Gallium nitride material, compared with silicon or gallium arsenide, is more suitable for fabricating high-temperature, high-frequency, high-voltage and high-power electronic devices. Therefore, the gallium nitride-based electronic device has good application prospects.

Because of strong two-dimensional electron gas in an AlGaN/GaN heterostructure, an AlGaN/GaN HEMT is usually a depletion mode device, and an enhancement mode device is difficult to be achieved. However, applications of the depletion device are limited in many situations; for example, an enhancement mode (normally-off) switching device is required as a power switching device. An enhancement mode gallium nitride switching device is mostly used in high-frequency devices, power switching devices and digital circuits, etc. Therefore, research on the enhancement mode gallium nitride switching device has great significance.

To achieve an enhancement mode gallium nitride switching device, an appropriate method is required to reduce channel carrier concentration under the gate region at zero gate bias, and the methods currently reported include recessing in the gate region, injecting fluorine ions into the barrier layer under the gate, and adopting a thin barrier layer, etc.

Recessing in the gate region is achieved by making slight changes in a structure of a conventional depletion mode AlGaN/GaN HEMT device. A E-beam gate is not directly formed but etching in a pre-deposited gate region is done first and then a Schottky gate is formed in the recessed gate window, where the electron density of electron gas in a channel is reduced by thinning down the barrier layer thickness. To pinch off the channel at zero gate voltage, the thickness of the barrier layer is reduced to less than 5 nm, and in this case, no effective quantum confinement is generated at a positive gate voltage and surface traps are formed, which causes the channel not to be completely opened at a positive gate voltage. In addition, gate leakage current is increased due to electrons in the surface traps. The method of a recessed gate is proposed in 2001 by Kumar et al. in University of Illinois in the United States, referring to Kumar, V., et al., "Recessed 0.25 mm gate AlGaN/GaN HEMTs on SiC with high gate-drain breakdown voltage using ICP-RIE", Electron. Lett. 2001, 37, pp. 1483-1485.

In case of fluorine implantation, negatively charged ions, such as fluorine ions, are injected into a barrier layer and the two-dimensional electron gas in the conductive channel can be depleted by controlling the dose of the injected ions. A high dose of anions is required to pinch-off the channel. Therefore, a current when the channel is opened is reduced. Y. Cai et al. at Hong Kong University of Science and Technology successfully developed a high performance enhancement mode AlGaN/GaN HEMT in 2005 by using fluoride-based plasma treatment technology, referring to Y. Cai et al., "High-performance enhancement-mode AlGaN/GaN HEMTs using fluoride-based plasma treatment", IEEE Electron Lett., vol. 2, no. 7, pp. 435-437, 2005.

In case of a thin barrier layer, the electron density of two-dimensional electron gas in a channel is reduced by adapting a thin AlGaN barrier layer. Akira ENDOH et al. at Osaka University in Japan prepare an enhancement-mode device using this method, with a threshold voltage of the prepared enhancement-mode device being zero, referring to Akira ENDOH et al., "Non-Recessed-Gate Enhancement-Mode AlGaN/GaN High Electron Mobility Transistors with High RF Performance", JJAP, Vol. 43, No. 4B, 2004, pp. 2255-2258.

The methods introduced above all belong to technology of a Schottky gate field-effect transistor and the threshold voltage is generally about 0V-1V, which does not reach the threshold voltage of 3V-5V for application. and the gate leakage current of the Schottcky gate technology is much larger than that of a metal insulator semiconductor field-effect transistor. In addition, plasma treatment is used in both of the method for recessing in the gate region and the method for injecting fluorine ions into a barrier layer under a gate region. However, the plasma treatment will destroy a lattice structure and damage an active region of a device, and repetitive control of the process is poor, therefore, stability and reliability of the device are affected.

SUMMARY

The application is to provide a method for fabricating an enhancement mode switching device. By forming a dielectric layer on a nitride transistor structure, forming a groove structure by locally thinning a gate region of the dielectric layer, and arranging p-type semiconductor material in the groove in the gate region, an n-type conductive layer below the gate is pinched off.

To achieve the above purpose, an enhancement mode switching device is provided, including:
  a substrate;
  a nitride transistor structure arranged on the substrate;
  a dielectric layer formed on the nitride transistor structure, where a gate region and two ohmic contact regions respectively located at two sides of the gate region are defined on the dielectric layer, and each of the two ohmic contact regions is through the dielectric layer;
  a groove formed in the gate region and at least partially through the dielectric layer;
  p-type semiconductor material formed in the groove; and
  a source electrode and a drain electrode located at the two ohmic contact regions.

Preferably, in the above enhancement mode switching device, the nitride transistor structure includes:
  a nitride nucleation layer located on the substrate;
  a nitride buffer layer located on the nitride nucleation layer; and
  a nitride channel layer located on the nitride buffer layer.

Preferably, in the above enhancement mode switching device, the nitride channel layer is non-doped or n-type doped.

Preferably, in the above enhancement mode switching device, the nitride transistor structure further includes a nitride barrier layer arranged on the nitride channel layer.

Preferably, in the above enhancement mode switching device, the nitride transistor structure further includes a nitride cap layer formed on the nitride barrier layer.

Preferably, in the above enhancement mode switching device, nitride in the nitride cap is gallium nitride or aluminum gallium nitride.

Preferably, in the above enhancement mode switching device, the dielectric layer includes a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Preferably, in the above enhancement mode switching device, the p-type semiconductor material is selected from p-type diamond, p-type NiO, p-type GaN or p-type polycrystalline GaN.

Preferably, in the above enhancement mode switching device, the enhancement mode switching device further includes a conductive metal layer formed on the p-type semiconductor material.

Preferably, in the above enhancement mode switching device, an additional dielectric layer is further deposited on an inner wall of the groove, and the p-type semiconductor material is formed on the additional dielectric layer.

Preferably, in the above enhancement mode switching device, material of the additional dielectric layer is selected from one or any combination of $Al_2O_3$, AlON, SiN, SiON, $SiO_2$ and $HfO_2$.

A method for fabricating an enhancement mode switching device is further disclosed in this application, including steps as follows:

providing a substrate, and forming a nitride transistor structure on the substrate;

forming a dielectric layer on the nitride transistor structure, where a gate region is defined on the dielectric layer;

forming, in the gate region, a groove extending toward the nitride transistor structure, where the groove is at least partially through the dielectric layer;

forming p-type semiconductor material in the groove;

etching the dielectric layer except for the gate region in the dielectric layer to form two ohmic contact regions; and forming a source electrode and a drain electrode at the two ohmic contact regions, respectively.

Preferably, the above method for fabricating the enhancement mode switching device further includes forming a conductive metal layer on the p-type semiconductor material after forming the p-type semiconductor material in the groove.

Preferably, in the above method for fabricating the enhancement mode switching device, the step of forming the nitride transistor includes:

forming a nitride nucleation layer on the substrate;

forming a nitride buffer layer on the nitride nucleation layer; and forming a nitride channel layer on the nitride buffer layer, where the nitride channel layer is non-doped or n-type doped; and forming a nitride barrier layer on the nitride channel layer.

Preferably, the above method for fabricating the enhancement mode switching device further includes forming a nitride cap layer on the nitride barrier layer, where nitride in the nitride cap is gallium nitride or aluminum gallium nitride.

Preferably, in the above method for fabricating the enhancement mode switching device, the dielectric layer includes a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Preferably, the above method for fabricating the enhancement mode switching device further includes performing oxidation treatment on the dielectric layer before forming p-type semiconductor material in the groove.

Preferably, the above method for fabricating the enhancement mode switching device further includes depositing an additional dielectric layer on an inner wall of the groove before forming the p-type semiconductor material in the groove.

Preferably, in the above method for fabricating the enhancement mode switching device, material of the additional dielectric layer is selected from one or any combination of $Al_2O_3$, AlON, SiN, SiON, $SiO_2$ and $HfO_2$.

Compared with the conventional technology, an n-type conductive layer below the gate is pinched off by forming a dielectric layer on a nitride transistor structure, forming a groove structure in a gate region of the dielectric layer and arranging p-type semiconductor material in the groove in the application. Therefore, a gallium nitride enhancement mode switching device is achieved with a simple process, and the fabricated device is stable and reliable. Conductivity can be increased by forming a conductive metal layer on the p-type semiconductor material.

BRIEF DESCRIPTION OF THE DRAWINGS

For clarity of description of solutions in embodiments of the application or conventional solutions, drawings for description of the embodiments and the conventional technology are briefly described below. Obviously, the drawings described below are merely a few embodiments of the application. Other drawings may be obtained by those skilled in the art according to these drawings without paying any creative work.

DETAILED DESCRIPTION

Figure 1A:
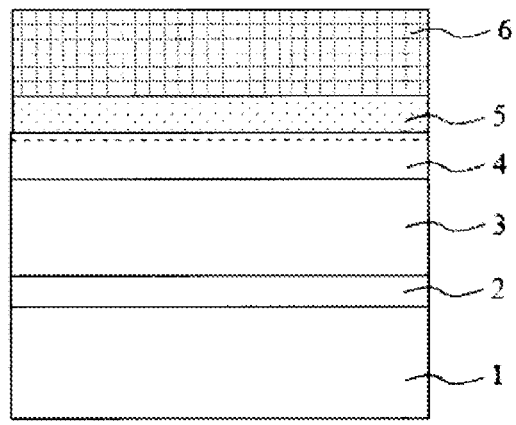
FIG. 1a-FIG. 1e are cross sections illustrating an enhancement mode switching device and a series of processes of a method for fabricating the same according to a first embodiment of the application.

The application is described below in detail with the embodiments shown in the drawings. However, the embodiments are not to limit the application. Modifications in structure, manner or function made by those skilled in the art according to the embodiments are within the protection scope of the application.

In addition, a same numeral or sign may be used in different embodiments. The reuse is merely for simplicity and clarity of description of the application, but indicates no relevancy among the various embodiments and/or structures.

Figure 1B:
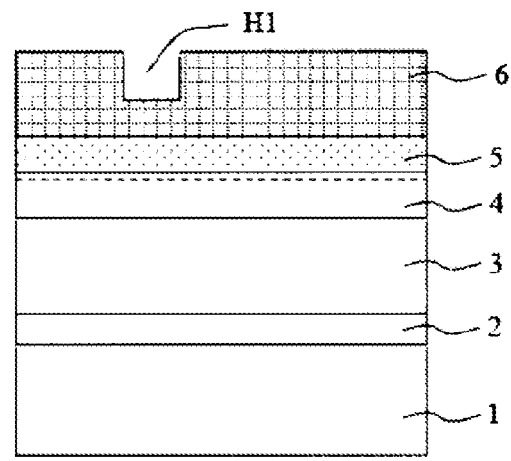
Figure 1C:
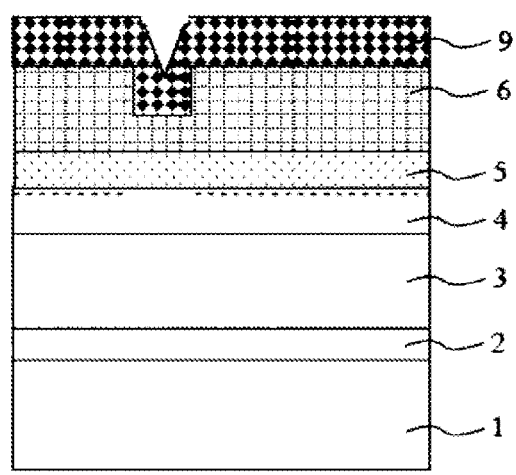
Figure 1D:
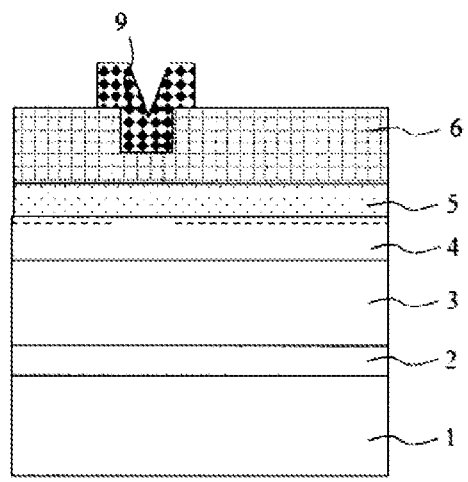
Figure 1E:
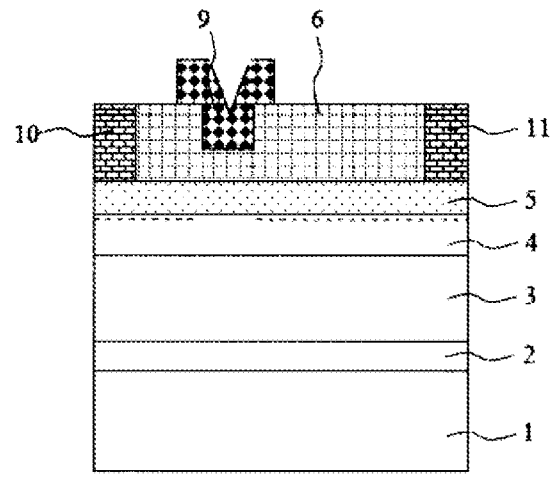

Referring to FIG. 1e, in a first embodiment of the application, an enhancement mode switching device includes: a substrate 1, and a nitride nucleation layer 2, a nitride buffer layer 3, a nitride channel layer 4, a nitride barrier layer 5 and a silicon nitride layer 6 which are formed on the substrate 1 in sequence. A groove H1 is arranged in a gate region of the silicon nitride layer 6 (referring to FIG. 1b). A height of the groove H1 is less than a thickness of the silicon nitride layer 6. P-type semiconductor material 9 is formed on an inner wall of the groove H1 and on the gate region. A source electrode 10 and a drain electrode 11 are arranged at two sides of the gate region, respectively. Each of the source electrode 10 and the drain electrode 11 is through the silicon nitride layer 6 in a vertical direction, and contacts with the nitride barrier layer 5.

FIG. 1a-FIG. 1e are cross sections illustrating the enhancement mode switching device and a series of processes of a method for fabricating the same according to the first embodiment of the application.

Referring to FIG. 1a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, a silicon nitride layer 6 is grown on the accomplished nitride transistor structure. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 1b, a groove H1 at least partially through the dielectric layer is formed by etching a gate region of the dielectric layer. Here the partially through indicates that the bottom of the groove is located within the dielectric layer. In the embodiment, the etching may be fluorine-based plasma etching, for example.

Referring to FIG. 1c, p-type semiconductor material 9 is deposited in the groove H1 formed by etching. The p-type semiconductor material 9 may be selected from p-type diamond, p-type NiO, p-type GaN or p-type polycrystalline GaN.

Referring to FIG. 1d, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 1e, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 2A:
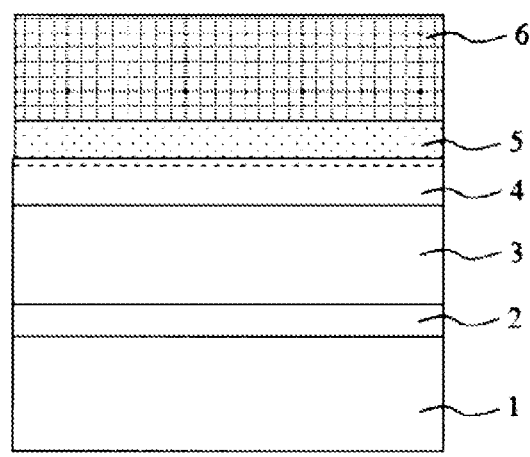
FIG. 2a-FIG. 2g are cross sections illustrating an enhancement mode switching device and a series of processes of a method for fabricating the same according to a second embodiment of the application.
Figure 2B:
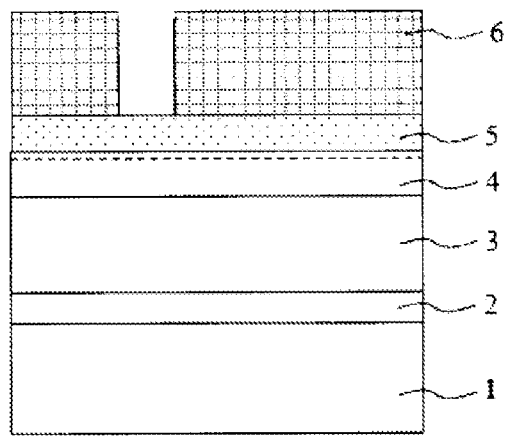
Figure 2C:
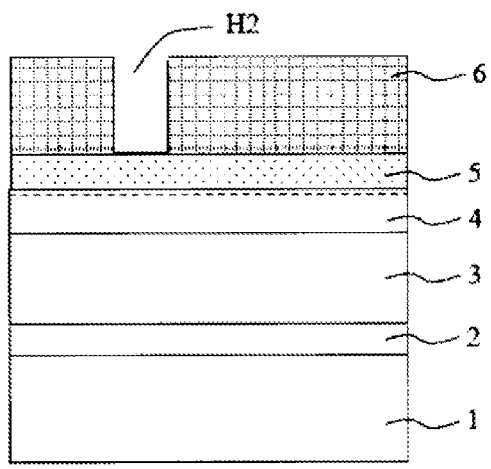
Figure 2D:
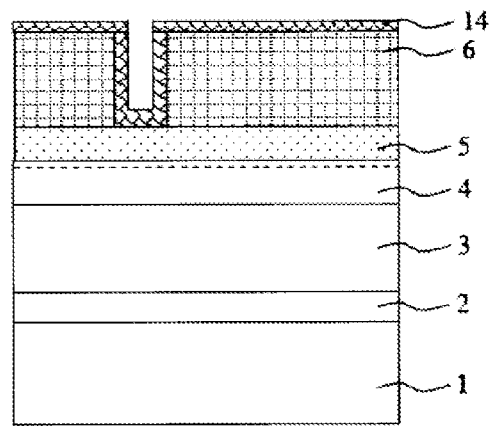
Figure 2E:
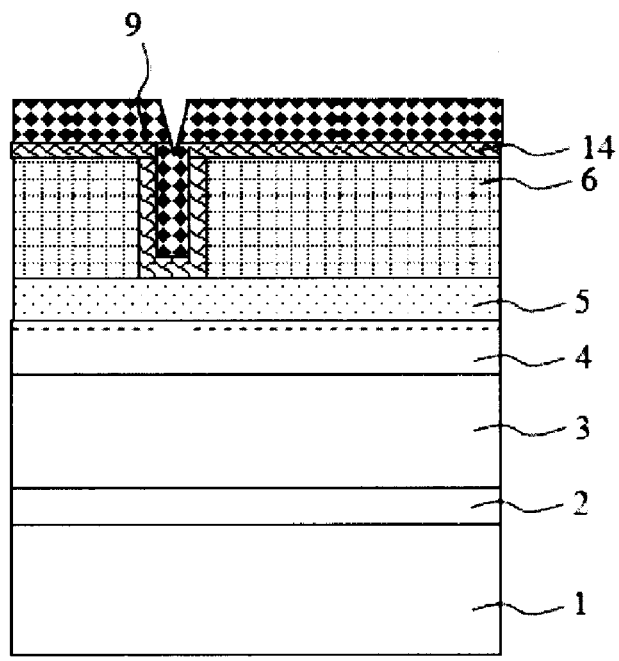
Figure 2F:
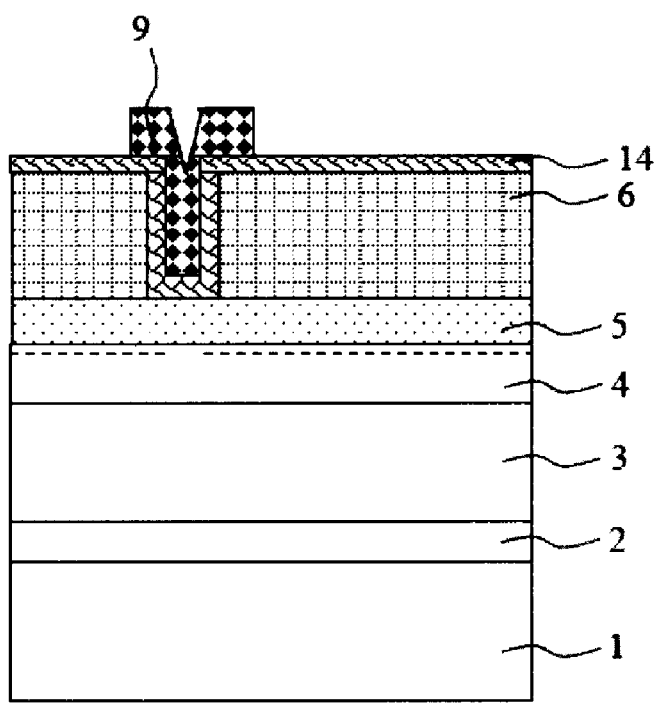
Figure 2G:
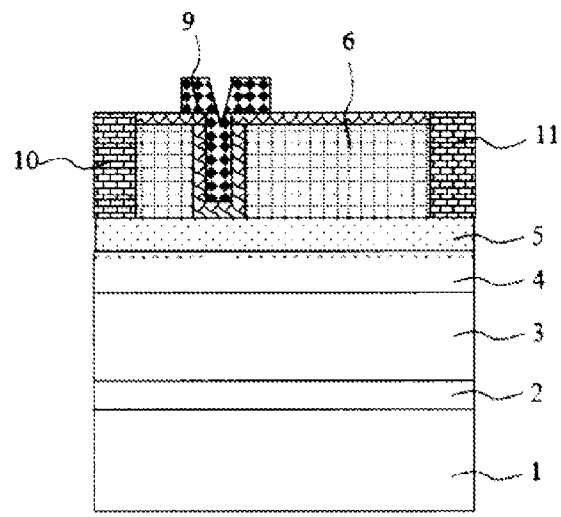

Referring to FIG. 2g, in a second embodiment of the application, an enhancement mode switching device includes: a substrate 1, and a nitride nucleation layer 2, a nitride buffer layer 3, a nitride channel layer 4, a nitride barrier layer 5 and a silicon nitride layer 6 which are formed on the substrate 1 in sequence. A groove H2 is arranged in a gate region of the silicon nitride layer 6 (referring to FIG. 2c). An additional dielectric layer 14 is formed on an inner wall of the groove H2 and on the silicon nitride layer 6. P-type semiconductor material 9 is formed on a gate region of the additional dielectric layer 14. A source electrode 10 and a drain electrode 11 are arranged at two sides of the gate region, respectively. Each of the source electrode 10 and the drain electrode 11 is through the additional dielectric layer 14 and the silicon nitride layer 6 in a vertical direction, and contacts with the nitride barrier layer 5.

FIG. 2a-FIG. 2g are cross sections illustrating the enhancement mode switching device and a series of processes of a method for fabricating the same according to the second embodiment of the application.

Referring to FIG. 2a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, a silicon nitride layer 6 is grown on the accomplished nitride transistor structure. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 2b-FIG. 2c, a groove H2 at least partially through the dielectric layer is formed by etching the gate region of the dielectric layer. Referring to FIG. 2d, an additional dielectric layer 14 is deposited in the groove H2 formed by etching. Material of the additional dielectric layer 14 may include, for example, $Al_2O_3$ or AlON. The additional dielectric layer 14 may be grown by Atomic Layer Deposition, Chemical Vapor Deposition, Molecular Beam Epitaxy, Plasma Enhanced Chemical Vapor Deposition or Low Pressure Chemical Vapor Deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$ and $HfO_2$.

Referring to FIG. 2e, p-type semiconductor material 9 is deposited on the additional dielectric layer 14 in the groove H2 formed by etching. The p-type semiconductor material 9 may be selected from p-type diamond, p-type NiO, p-type GaN or p-type polycrystalline GaN, for example.

Referring to FIG. 2f, the p-type semiconductor material 9 on the additional dielectric layer 14 except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional metal layer.

Referring to FIG. 2g, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 3A:
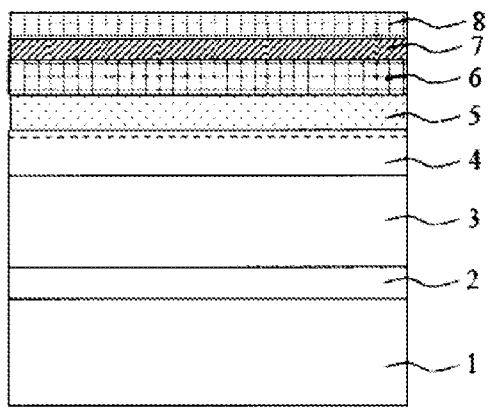
FIG. 3a-FIG. 3e are cross sections illustrating an enhancement mode switching device and a series of processes of a method for fabricating the same according to a third embodiment of the application.
Figure 3B:
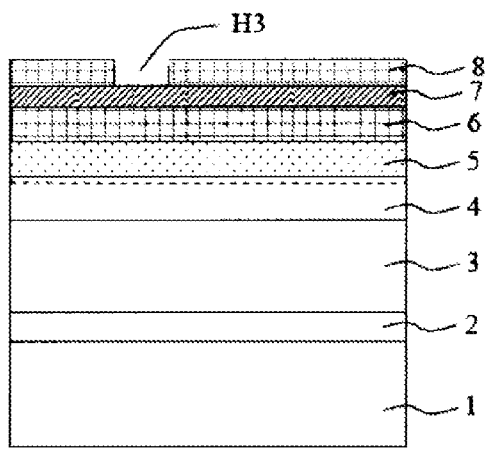
Figure 3C:
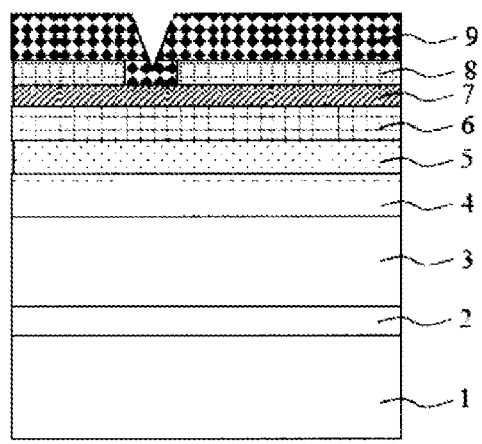
Figure 3D:
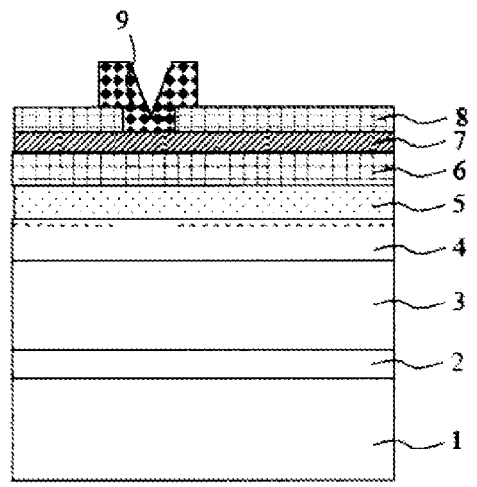
Figure 3E:
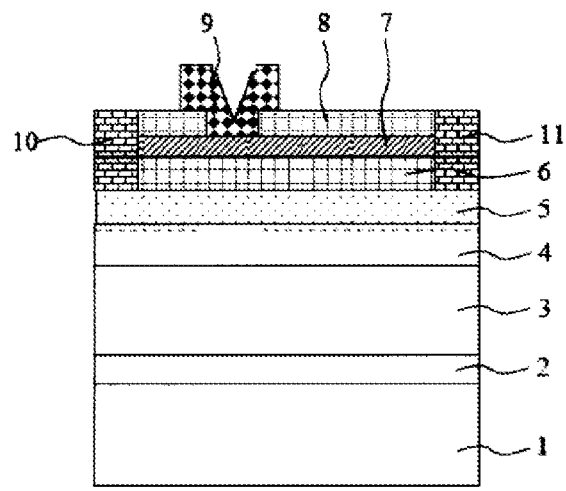

Referring to FIG. 3e, in a third embodiment of the application, an enhancement mode switching device includes: a substrate 1, and a nitride nucleation layer 2, a nitride buffer layer 3, a nitride channel layer 4, a nitride barrier layer 5, a silicon nitride layer 6, an aluminum nitride layer 7 and a silicon nitride layer 8 which are formed on the substrate 1 in sequence. A groove H3 is arranged in a gate region of the silicon nitride layer 8 (referring to FIG. 3b). A height of the groove H3 is equal to a thickness of the silicon nitride layer 8. P-type semiconductor material 9 is formed on an inner wall of the groove H3 and on the gate region. A source electrode 10 and a drain electrode 11 are arranged at two sides of the gate region, respectively. Each of the source electrode 10 and the drain electrode 11 is through the silicon nitride layer 8, the aluminum nitride layer 7 and the silicon nitride layer 6 in a vertical direction, and contacts with the nitride barrier layer 5.

FIG. 3a-FIG. 3e are cross sections illustrating the enhancement mode switching device and a series of processes of a method for fabricating the same according to the third embodiment of the application.

Referring to FIG. 3a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, a silicon nitride layer 6, an aluminum nitride layer 7 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 3b, a groove H3 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum nitride layer 7.

Referring to FIG. 3c, p-type semiconductor material 9 is deposited in the groove H3 formed by etching. The p-type semiconductor material 9 may be selected from p-type diamond, p-type NiO, p-type GaN, or p-type polycrystalline GaN, etc.

Referring to FIG. 3d, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional metal layer.

Referring to FIG. 3e, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 4A:
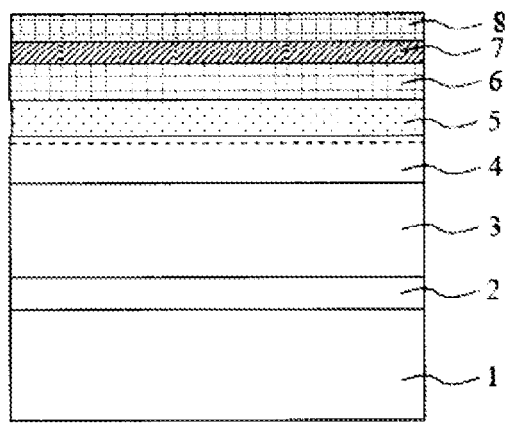
FIG. 4a-FIG. 4f are cross sections illustrating an enhancement mode switching device and a series of processes of a method for fabricating the same according to a fourth embodiment of the application.
Figure 4B:
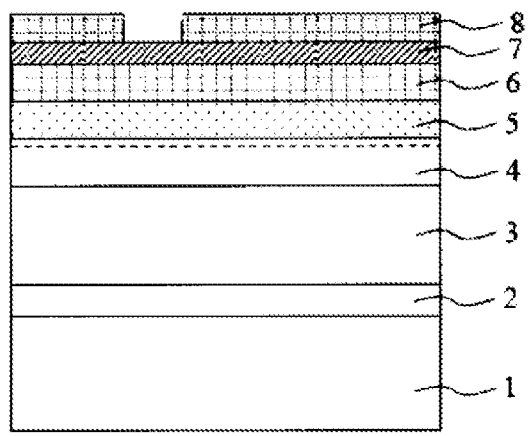
Figure 4C:
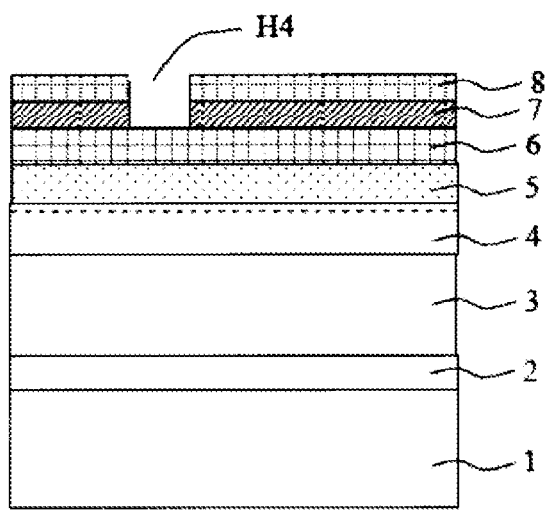
Figure 4D:
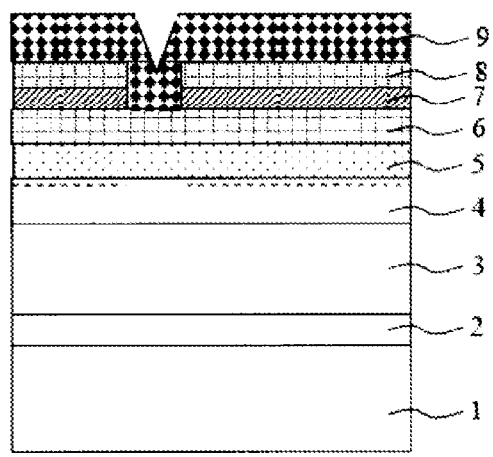
Figure 4E:
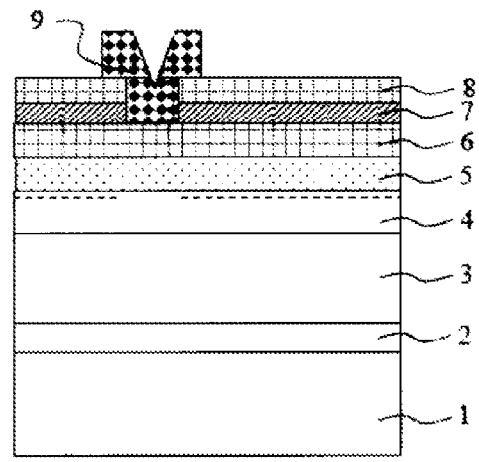
Figure 4F:
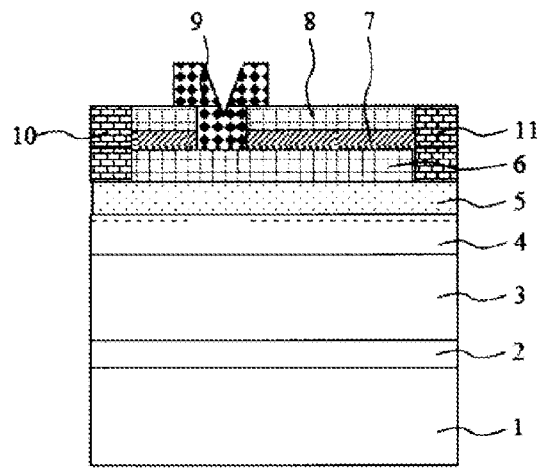

Referring to FIG. 4f, in a fourth embodiment of the application, an enhancement mode switching device includes: a substrate 1, and a nitride nucleation layer 2, a nitride buffer layer 3, a nitride channel layer 4, a nitride barrier layer 5, a silicon nitride layer 6, an aluminum nitride layer 7 and a silicon nitride layer 8 which are formed on the substrate 1 in sequence. A groove H4 is arranged in a gate region of the silicon nitride layer 8 (referring to FIG. 4c). A height of the groove H4 is equal to a sum of a thickness of the silicon nitride layer 8 and a thickness of the aluminum nitride layer 7. P-type semiconductor material 9 is formed on an inner wall of the groove H4 and on the gate region. A source electrode 10 and a drain electrode 11 are arranged at two sides of the gate region, respectively. Each of the source electrode 10 and the drain electrode 11 is through the silicon nitride layer 8, the aluminum nitride layer 7 and the silicon nitride layer 6 in a vertical direction, and contacts with the nitride barrier layer 5.

FIG. 4a-FIG. 4f are cross sections illustrating the enhancement mode switching device and a series of processes of a method for fabricating the same according to the fourth embodiment of the application.

Referring to FIG. 4a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, a silicon nitride layer 6, an aluminum nitride layer 7 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 4b and FIG. 4c, a groove H4 at least partially through the dielectric layer is formed by etching a gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum nitride layer 7. The aluminum nitride layer is then etched through by wet etching or dry etching, to form the groove H4.

Referring to FIG. 4d, p-type semiconductor material 9 is deposited in the groove H4 formed by etching. The p-type semiconductor material 9 may be selected from p-type diamond, p-type NiO, p-type GaN, or p-type polycrystalline GaN, etc.

Referring to FIG. 4e, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 4f, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 5A:
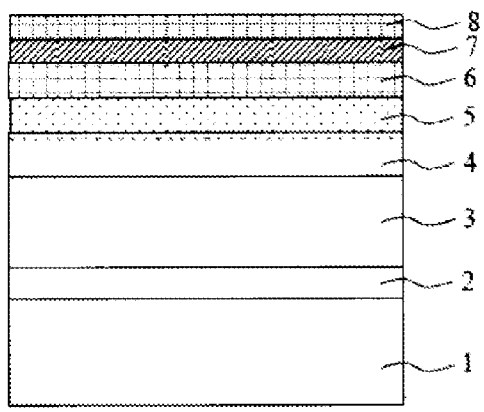
FIG. 5a-FIG. 5f are cross sections illustrating an enhancement mode switching device and a series of processes of a method for fabricating the same according to a fifth embodiment of the application.
Figure 5B:
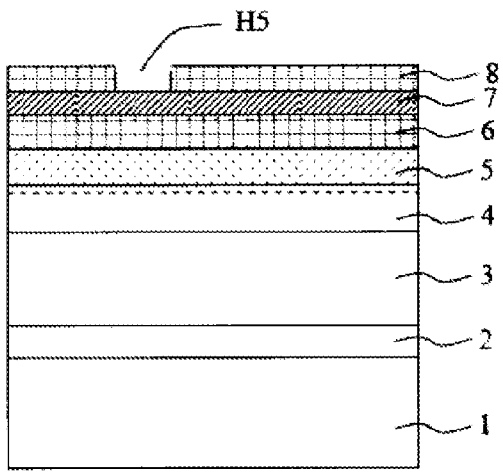
Figure 5C:
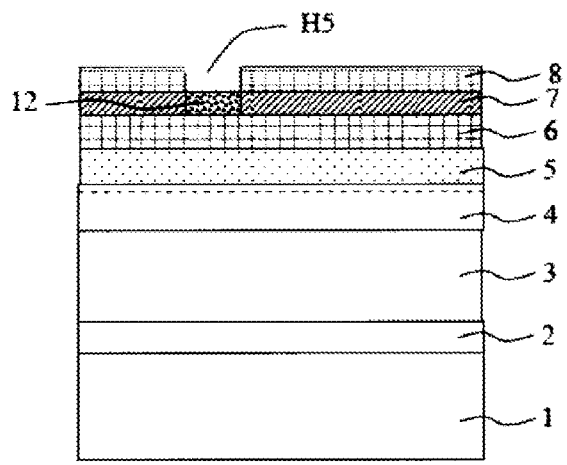
Figure 5D:
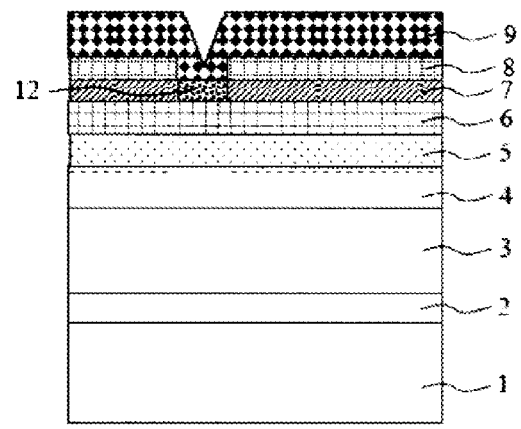
Figure 5E:
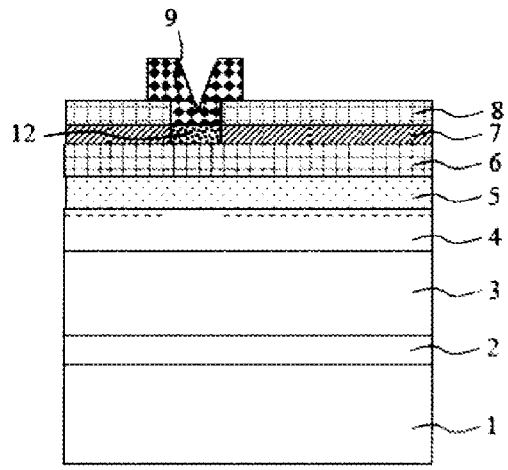
Figure 5F:
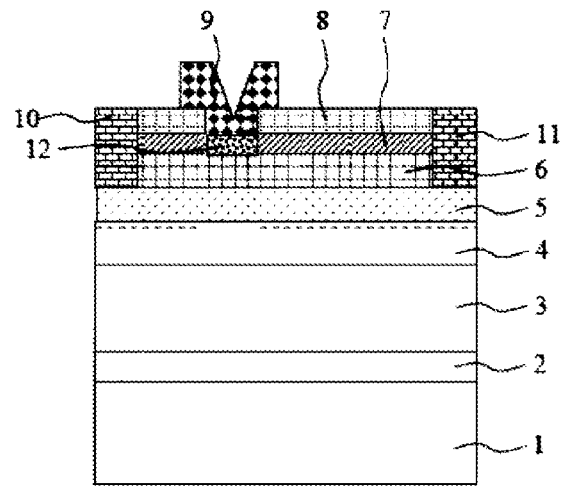

Referring to FIG. 5f, in a fifth embodiment of the application, an enhancement mode switching device includes: a substrate 1, and a nitride nucleation layer 2, a nitride buffer layer 3, a nitride channel layer 4, a nitride barrier layer 5, a silicon nitride layer 6, an aluminum nitride layer 7 and a silicon nitride layer 8 which are formed on the substrate 1 in sequence. A groove H5 is arranged in a gate region of the silicon nitride layer 8 (referring to FIG. 5b). A height of the groove H5 is equal to a thickness of the silicon nitride layer 8. P-type semiconductor material is formed on an inner wall of the groove H5 and on the gate region. A source electrode 10 and a drain electrode 11 are arranged at two sides of the gate region, respectively. Each of the source electrode 10 and the drain electrode 11 is through the silicon nitride layer 8, the aluminum nitride layer 7 and the silicon nitride layer 6 in a vertical direction, and contacts with the nitride barrier layer 5. An $Al_2O_3$ layer 12 or an AlON layer 12 is further arranged between the bottom of the groove H5 and the silicon nitride layer 6.

FIG. 5a-FIG. 5f are cross sections illustrating the enhancement mode switching device and a series of processes of a method for fabricating the same according to the fifth embodiment of the application.

Referring to FIG. 5a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, a silicon nitride layer 6, an aluminum nitride layer 7 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 5b, a groove H5 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum nitride layer 7.

Referring to FIG. 5c, after the etching is completed, the aluminum nitride layer corresponding to the groove H5 may be oxidized by a method of thermal oxidation, wet oxidation, oxygen ions, or ozone, etc. In the embodiment, the aluminum nitride layer herein may be converted into an $Al_2O_3$ layer 12 or an AlON layer 12.

Referring to FIG. 5d, p-type semiconductor material 9 is deposited in the groove H5 formed by etching. The p-type semiconductor material 9 may be selected from p-type diamond, p-type NiO, p-type GaN, or p-type polycrystalline GaN, etc.

Referring to FIG. 5e, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 5f, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 6A:
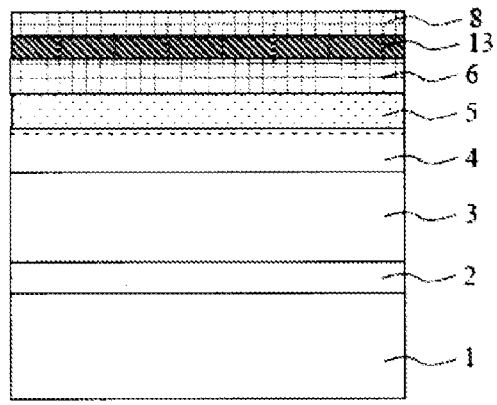
FIG. 6a-FIG. 6f are cross sections illustrating an enhancement mode switching device and a series of processes of a method for fabricating the same according to a sixth embodiment of the application.
Figure 6B:
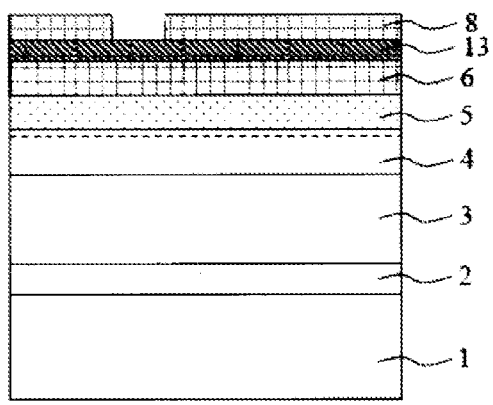
Figure 6C:
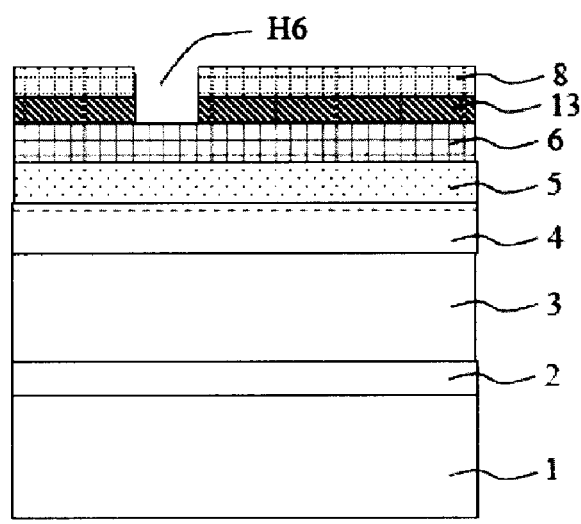
Figure 6D:
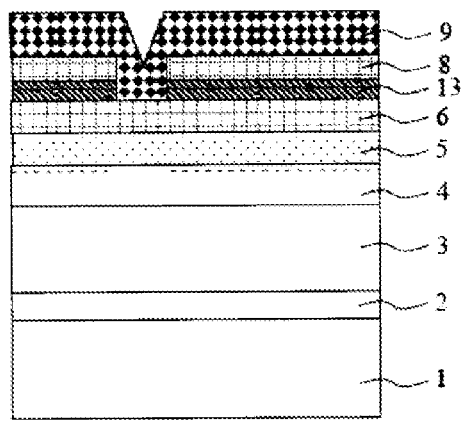
Figure 6E:
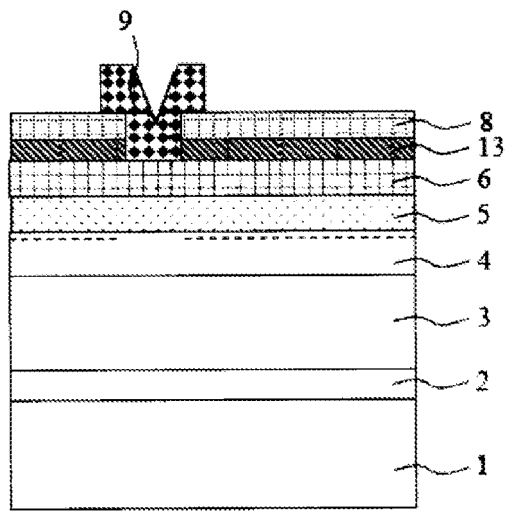
Figure 6F:
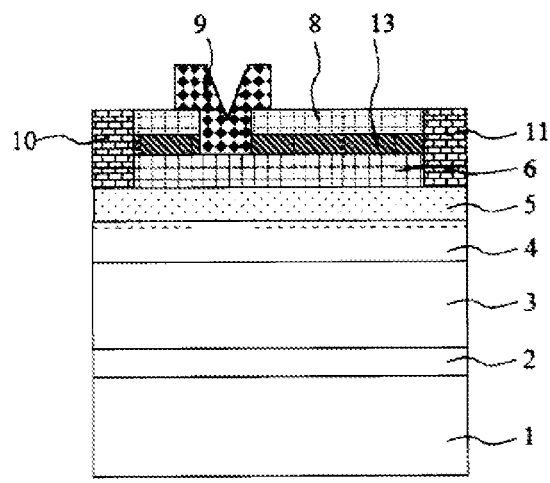

Referring to FIG. 6f, in a sixth embodiment of the application, an enhancement mode switching device includes: a substrate 1, and a nitride nucleation layer 2, a nitride buffer layer 3, a nitride channel layer 4, a nitride barrier layer 5, a silicon nitride layer 6, an aluminum silicon nitride layer 13 and a silicon nitride layer 8 which are formed on the substrate 1 in sequence. A groove H6 is arranged in a gate region of the silicon nitride layer 8

(referring to FIG. 6c). A height of the groove H6 is equal to a sum of a thickness of the silicon nitride layer 8 and a thickness of the aluminum silicon nitride layer 13. P-type semiconductor material is formed on an inner wall of the groove H4 and on the gate region. A source electrode 10 and a drain electrode 11 are arranged at two sides of the gate region, respectively. Each of the source electrode 10 and the drain electrode 11 is through the silicon nitride layer 8, the aluminum silicon nitride layer 13 and the silicon nitride layer 6 in a vertical direction, and contacts with the nitride barrier layer 5.

FIG. 6a-FIG. 6f are cross sections illustrating the enhancement mode switching device and a series of processes of a method for fabricating the same according to the sixth embodiment of the application.

Referring to FIG. 6a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer then is grown on the accomplished nitride transistor structure. A gate region is defined on the dielectric layer. Specifically, a silicon nitride layer 6, an aluminum silicon nitride layer 13 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 6b and FIG. 6c, a groove H6 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum silicon nitride layer 13. The aluminum silicon nitride layer is then etched through by wet etching or dry etching, to form the groove H6.

Referring to FIG. 6d, p-type semiconductor material 9 is deposited in the groove H6 formed by etching. The p-type semiconductor material 9 may be selected from p-type diamond, p-type NiO, p-type GaN, or p-type polycrystalline GaN, etc.

Referring to FIG. 6e, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 6f, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 7A:
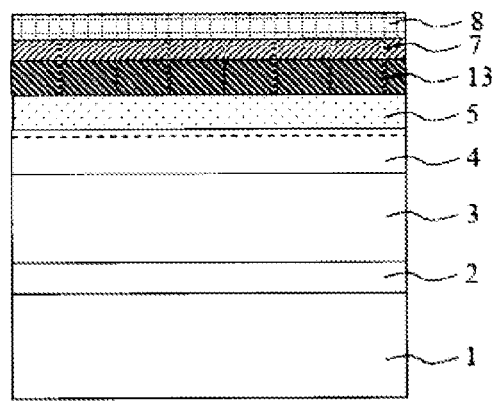
FIG. 7a-FIG. 7f are cross sections illustrating an enhancement mode switching device and a series of processes of a method for fabricating the same according to a seventh embodiment of the application.
Figure 7B:
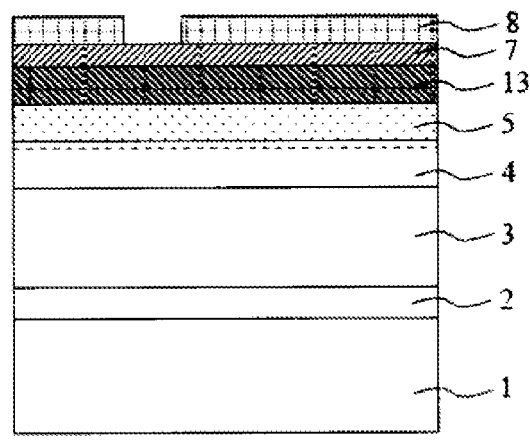
Figure 7C:
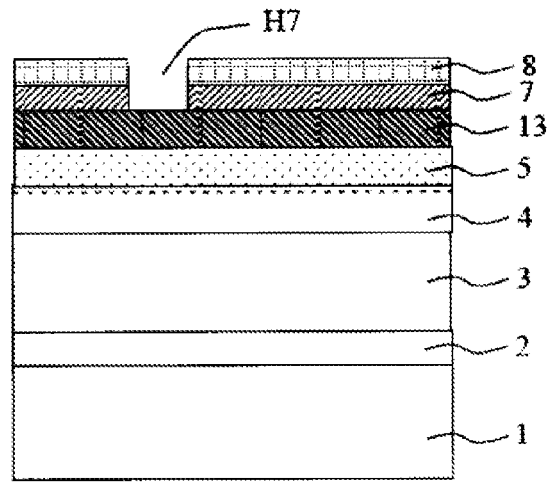
Figure 7D:
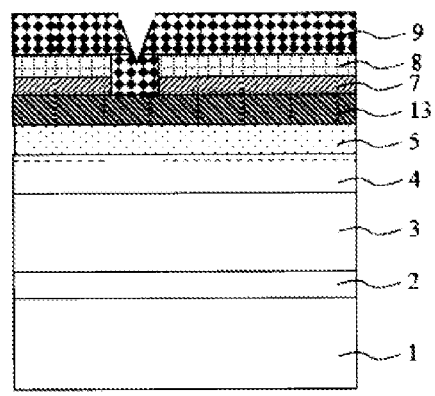
Figure 7E:
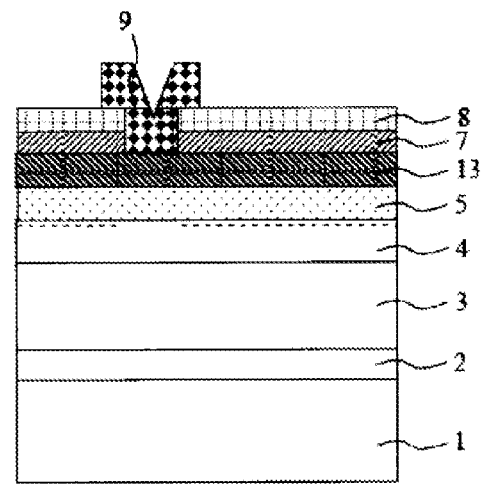
Figure 7F:
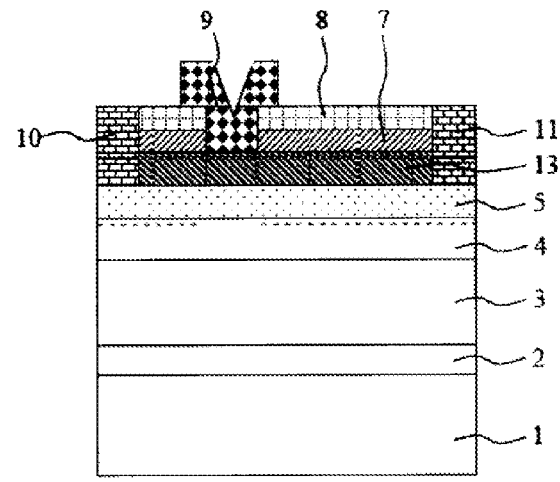

Referring to FIG. 7f, in a seventh embodiment of the application, an enhancement mode switching device includes: a substrate 1, and a nitride nucleation layer 2, a nitride buffer layer 3, a nitride channel layer 4, a nitride barrier layer 5, an aluminum silicon nitride layer 13, an aluminum nitride layer 7 and a silicon nitride layer 8 which are formed on the substrate 1 in sequence. A groove H7 is arranged in a gate region of the silicon nitride layer 8 (referring to FIG. 7c). A height of the groove H7 is equal to a sum of a thickness of the silicon nitride layer 8 and a thickness of the aluminum nitride layer 7. P-type semiconductor material is formed on an inner wall of the groove H5 and on the gate region. A source electrode 10 and a drain electrode 11 are formed at two sides of the gate region, respectively. Each of the source electrode 10 and the drain electrode 11 is through the silicon nitride layer 8, the aluminum nitride layer 7 and the aluminum silicon nitride layer 13 in a vertical direction, and contacts with the nitride barrier layer 5.

FIG. 7a-FIG. 7f are cross sections illustrating the enhancement mode switching device and a series of processes of a method for fabricating the same according to the seventh embodiment of the application.

Referring to FIG. 7a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, an aluminum silicon nitride layer 13, an aluminum nitride layer 7 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 7b and FIG. 7c, a groove H7 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum nitride layer 7. The aluminum nitride layer is then etched through by wet etching or dry etching, to form the groove H7.

Referring to FIG. 7d, p-type semiconductor material 9 is deposited in the groove H5 formed by etching. The p-type semiconductor material 9 may be selected from p-type diamond, p-type NiO, p-type GaN, or p-type polycrystalline GaN, etc.

Referring to FIG. 7e, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 7f, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 8A:
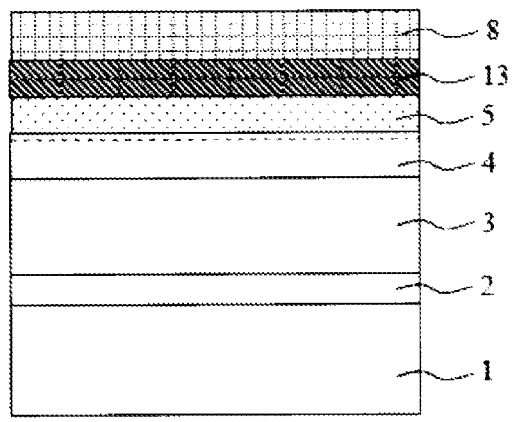
FIG. 8a-FIG. 8e are cross sections illustrating an enhancement mode switching device and a series of processes of a method for fabricating the same according to an eighth embodiment of the application.
Figure 8B:
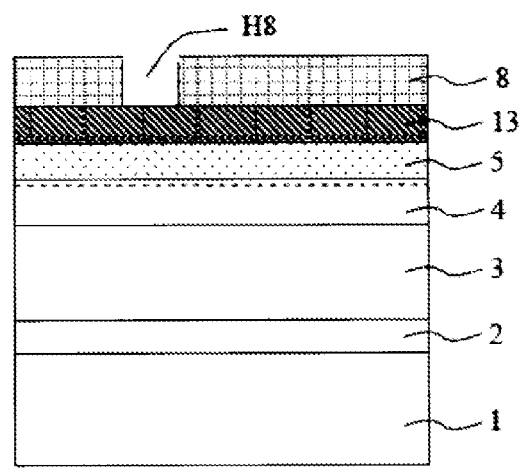
Figure 8C:
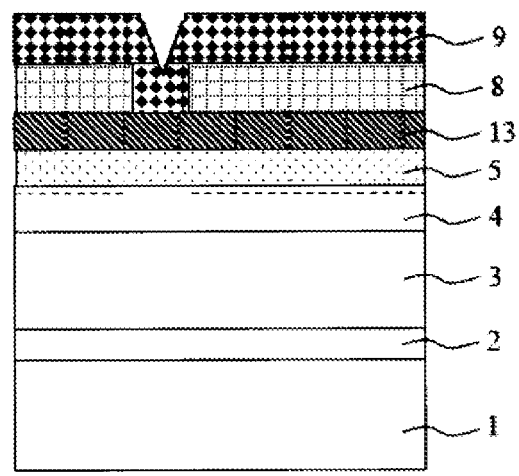
Figure 8D:
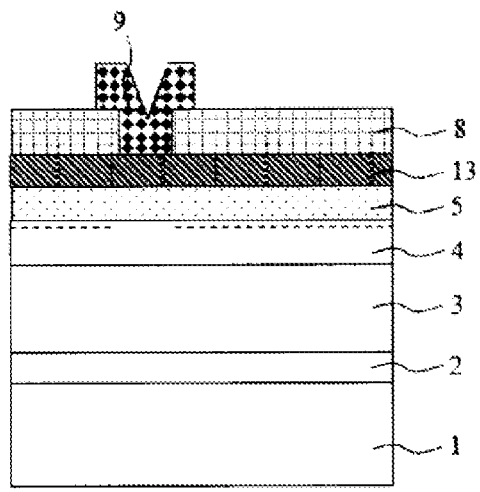
Figure 8E:
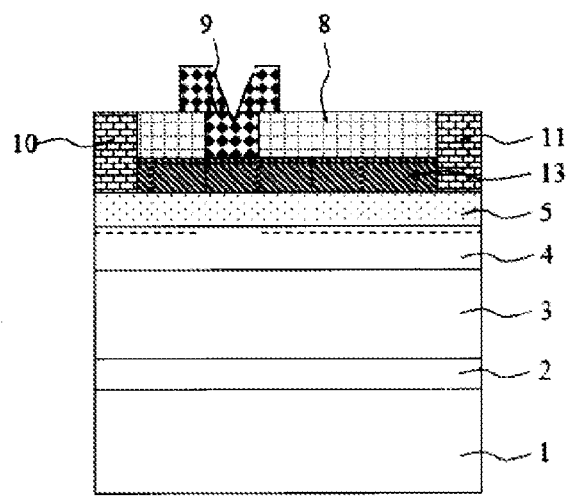

Referring to FIG. 8e, in an eighth embodiment of the application, an enhancement mode switching device includes: a substrate 1, and a nitride nucleation layer 2, a nitride buffer layer 3, a nitride channel layer 4, a nitride barrier layer 5, an aluminum silicon nitride layer 13 and a silicon nitride layer 8 which are formed on the substrate 1 in sequence. A groove H8 is arranged in a gate region of the silicon nitride layer 8 (referring to FIG. 8b). A height of the groove H8 is equal to a thickness of the silicon nitride layer 8. P-type semiconductor material 9 is formed on an inner wall of the groove H8 and on the gate region. A source electrode 10 and a drain electrode 11 are arranged at two sides of the gate region, respectively. Each of the source electrode 10 and the drain electrode 11 is through the silicon nitride layer 8 and the aluminum silicon nitride layer 13 in a vertical direction, and contacts with the nitride barrier layer 5.

FIG. 8a-FIG. 8e are cross sections illustrating the enhancement mode switching device and a series of processes of a method for fabricating the same according to the eighth embodiment of the application.

Referring to FIG. 8a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, an aluminum silicon nitride layer 13 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 8b, a groove H8 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum silicon nitride layer 13, to form the groove H8.

Referring to FIG. 5c, p-type semiconductor material 9 is deposited in the groove H8 formed by etching. The p-type semiconductor material 9 may be selected from p-type diamond, p-type NiO, p-type GaN, or p-type polycrystalline GaN, etc.

Referring to FIG. 8e, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 8e, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 9A:
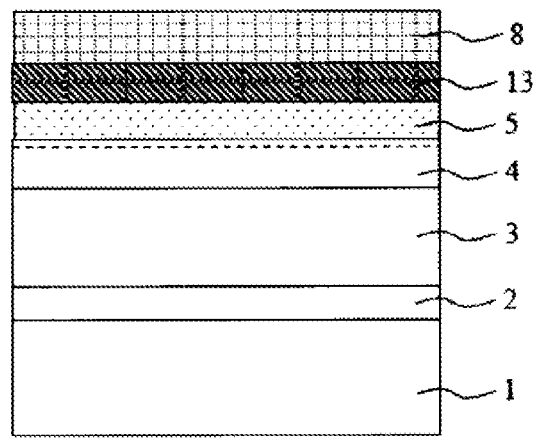
FIG. 9a-FIG. 9f are cross sections illustrating an enhancement mode switching device and a series of processes of a method for fabricating the same according to a ninth embodiment of the application.
Figure 9B:
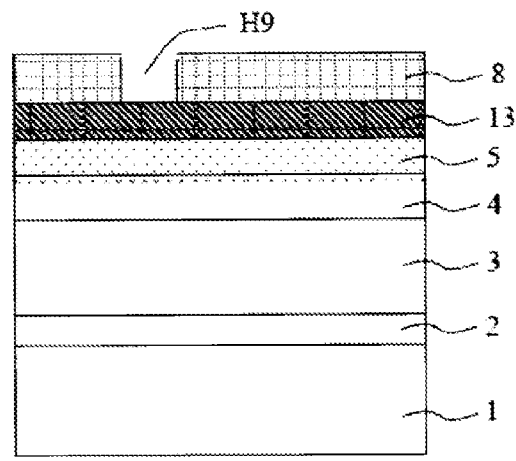
Figure 9C:
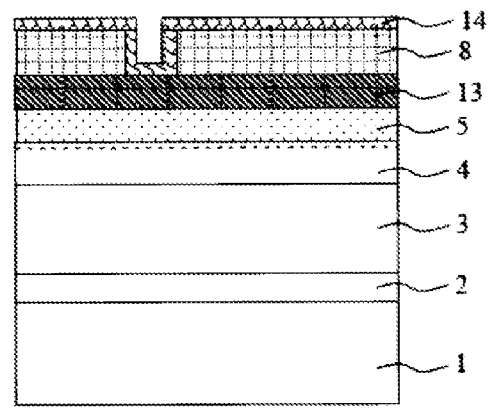
Figure 9D:
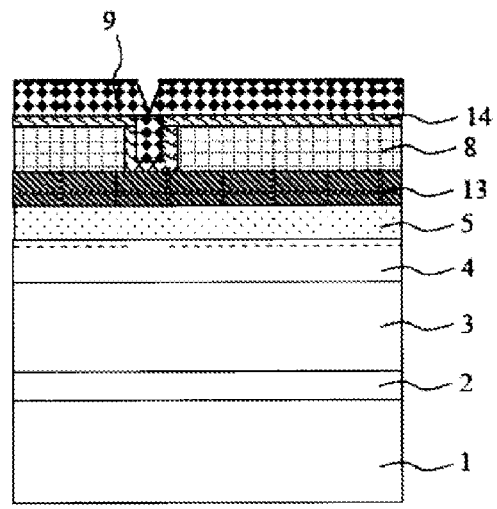
Figure 9E:
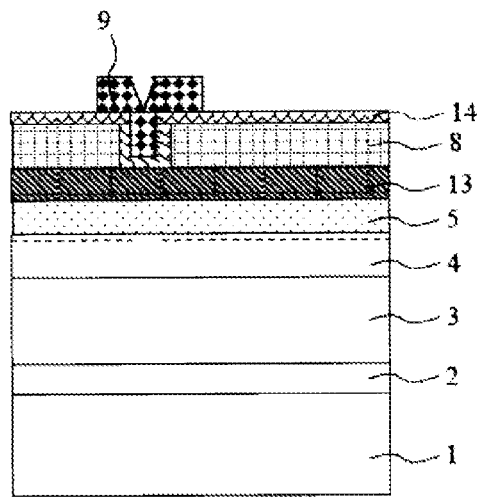
Figure 9F:
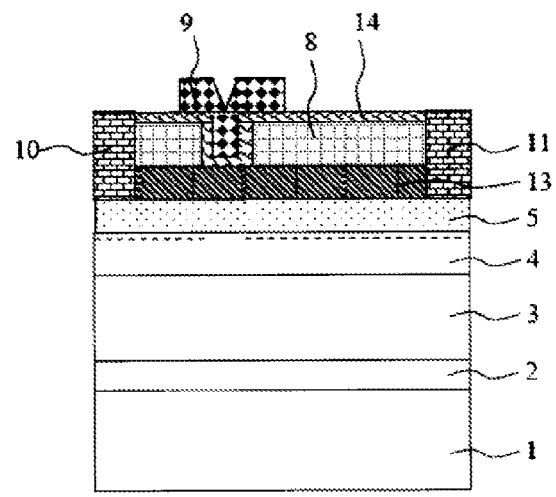

Referring to FIG. 9f, in a ninth embodiment of the application, an enhancement mode switching device includes: a substrate 1, and a nitride nucleation layer 2, a nitride buffer layer 3, a nitride channel layer 4, a nitride barrier layer 5, an aluminum silicon nitride layer 13 and a silicon nitride layer 8 which are formed on the substrate 1 in sequence. A groove H9 is arranged in a gate region of the silicon nitride layer 8 (referring to FIG. 9b). A height of the groove H9 is equal to a thickness of the silicon nitride layer 8. An additional dielectric layer 14 is formed on an inner wall of the groove H9 and on the silicon nitride layer 8. P-type semiconductor material 9 is formed on a gate region of the additional dielectric layer 14. A source electrode 10 and a drain electrode 11 are arranged at two sides of the gate region, respectively. Each of the source electrode 10 and the drain electrode 11 is through the additional dielectric layer 14, the silicon nitride layer 8 and the aluminum silicon nitride layer 13 in a vertical direction, and contacts with the nitride barrier layer 5.

FIG. 9a-FIG. 9f are cross sections illustrating the enhancement mode switching device and a series of processes of a method for fabricating the same according to the ninth embodiment of the application.

Referring to FIG. 9a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4 and a nitride barrier layer 5 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, an aluminum silicon nitride layer 13 and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 9b, a groove H9 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum silicon nitride layer 13, to form the groove H9.

Referring to FIG. 9c, an additional dielectric layer 14 is deposited in the groove H9 formed by etching. Material of the additional dielectric layer 14 may include, for example, $Al_2O_3$ or AlON. The additional dielectric layer 14 may be grown by Atomic Layer Deposition, Chemical Vapor Deposition, Molecular Beam Epitaxy, Plasma Enhanced Chemical Vapor Deposition or Low Pressure Chemical Vapor Deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$ and $HfO_2$.

Referring to FIG. 9d, p-type semiconductor material 9 is deposited on the additional dielectric layer 14 in the groove H9 formed by etching. The p-type semiconductor material 9 may be selected from p-type diamond, p-type NiO, p-type GaN, or p-type polycrystalline GaN, etc.

Referring to FIG. 9e, the p-type semiconductor material 9 on the additional dielectric layer 14 except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 9f, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 10A:
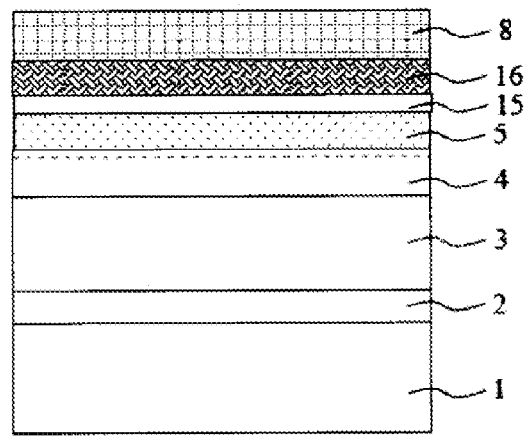
FIG. 10a-FIG. 10e are cross sections illustrating an enhancement mode switching device and a series of processes of a method for fabricating the same according to a tenth embodiment of the application.
Figure 10B:
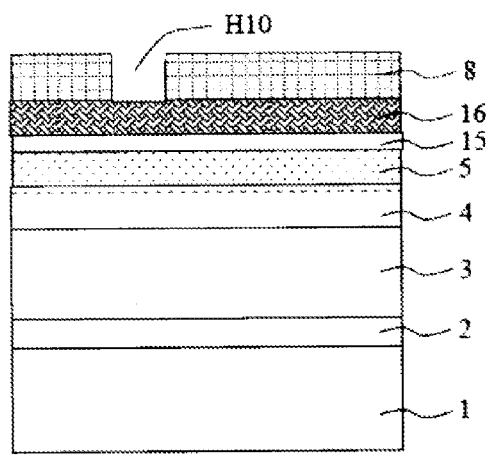
Figure 10C:
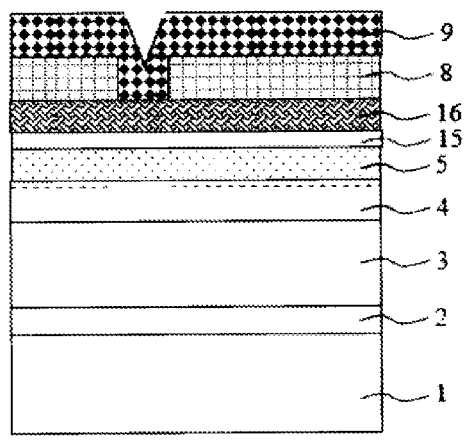
Figure 10D:
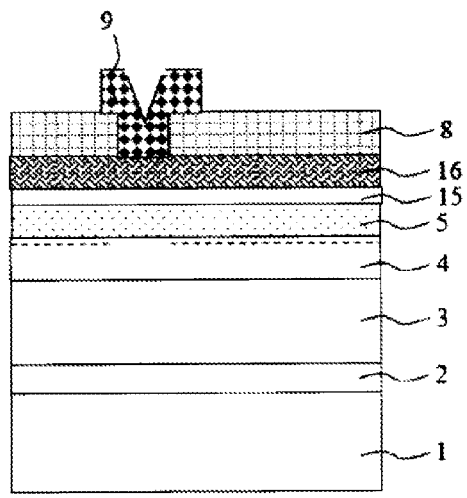
Figure 10E:
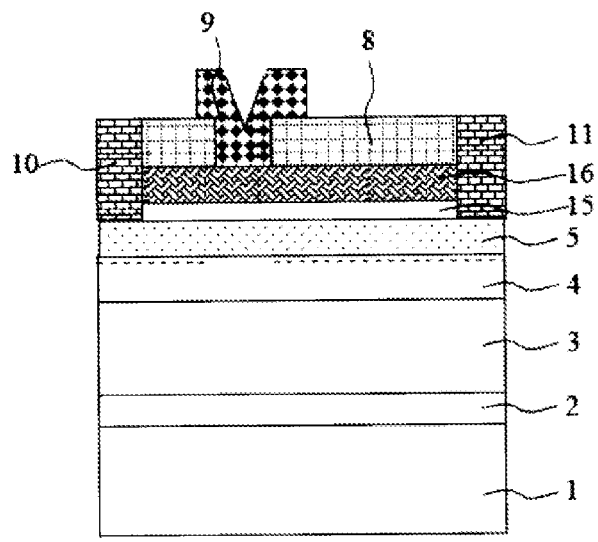

Referring to FIG. 10e, in a tenth embodiment of the application, an enhancement mode switching device includes: a substrate 1, and a nitride nucleation layer 2, a nitride buffer layer 3, a nitride channel layer 4, a nitride barrier layer 5, a cap layer 15, an aluminum oxide layer 16 (or an aluminum oxynitride layer 16) and a silicon nitride layer 8 which are formed on the substrate 1 in sequence. A groove H10 is arranged in a gate region of the silicon nitride layer 8 (referring to FIG. 10b). A height of the groove H10 is equal to a thickness of the silicon nitride layer 8. P-type semiconductor material 9 is formed on an inner wall of the groove H10 and on a gate region. A source electrode 10 and a drain electrode 11 are arranged at two sides of the gate region, respectively. Each of the source electrode 10 and the drain electrode 11 is through the silicon nitride layer 8, the aluminum oxide layer 16 (or the aluminum oxynitride layer 16) and the cap layer 15, and contacts with the nitride barrier layer 5.

FIG. 10a-FIG. 10e are cross sections illustrating the enhancement mode switching device and a series of processes of a method for fabricating the same according to the tenth embodiment of the application.

Referring to FIG. 10a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride is preferably AlInGaN. Specifically, a nitride nucleation layer 2, a nitride buffer layer 3, a nitride channel layer 4, a nitride barrier layer 5 and a cap layer 15 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. The cap layer 15 may be gallium nitride, or may also include aluminum (aluminum gallium nitride), where a compositional ratio of aluminum may be a constant or decrease gradually or increase first and then decrease, or a super lattice structure is formed with a compositional ratio of aluminum varying periodically. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, an aluminum oxide layer 16 (or an aluminum oxynitride layer 16) and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 10b, a groove H10 at least partially through the dielectric layer is formed by etching the gate region of the dielectric layer. Here, the partially through indicates that the bottom of the groove is located within the dielectric layer. In the embodiment, fluorine-based plasma etching, for example, may be adopted in the etching process. Due to selective etching by the fluorine-based plasma etching treatment, the etching process stops when reaching the aluminum oxide layer 16 (or the aluminum oxynitride layer 16), to form the groove H10.

Referring to FIG. 10e, p-type semiconductor material 9 is deposited in the groove H8 formed by etching. The p-type semiconductor material 9 may be selected from p-type diamond, p-type NiO, p-type GaN, or p-type polycrystalline GaN, etc.

Referring to FIG. 10d, the p-type semiconductor material 9 on the dielectric layer except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 10e, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

Figure 11A:
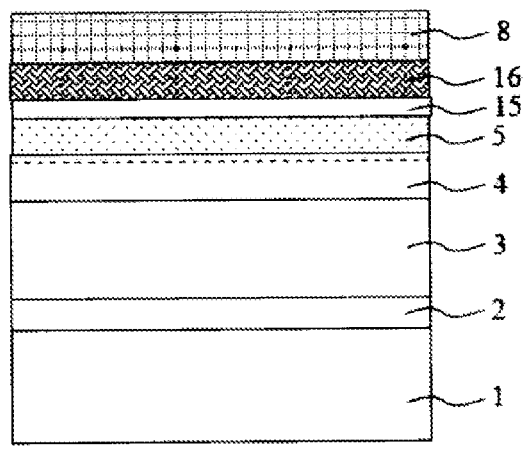
FIG. 11a-FIG. 11g are cross sections illustrating an enhancement mode switching device and a series of processes of a method for fabricating the same according to an eleventh embodiment of the application.
Figure 11B:
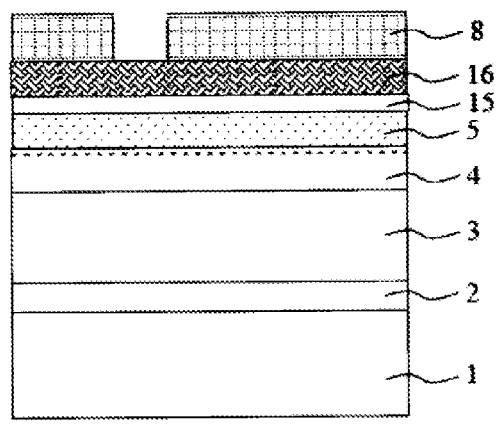
Figure 11C:
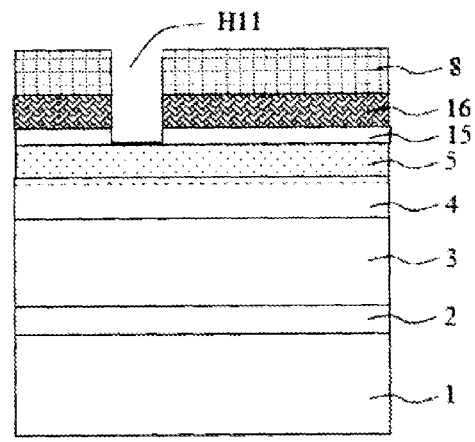
Figure 11D:
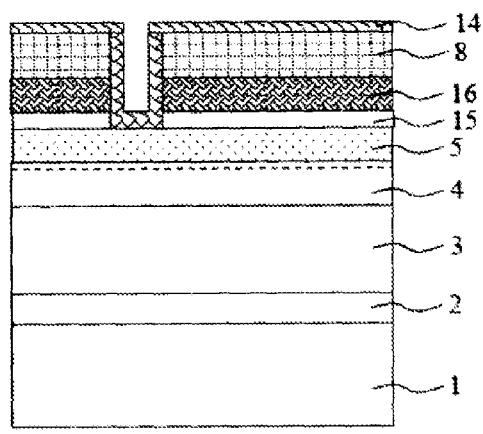
Figure 11E:
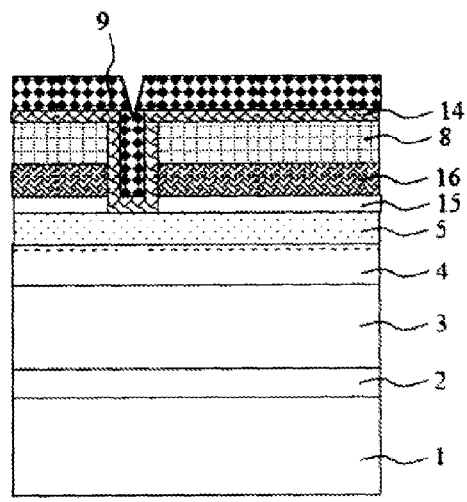
Figure 11F:
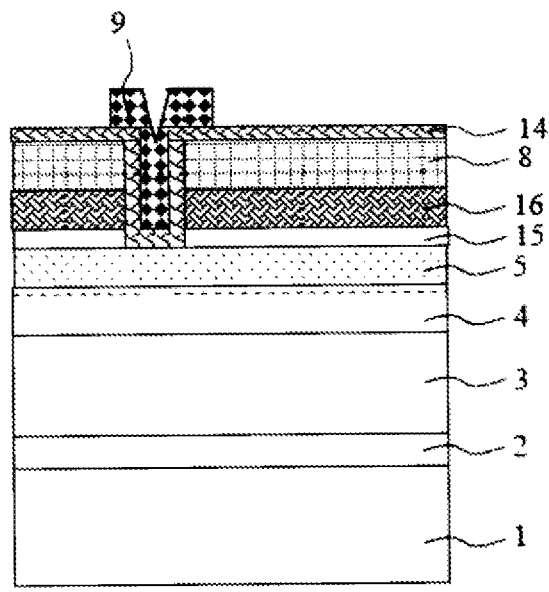
Figure 11G:
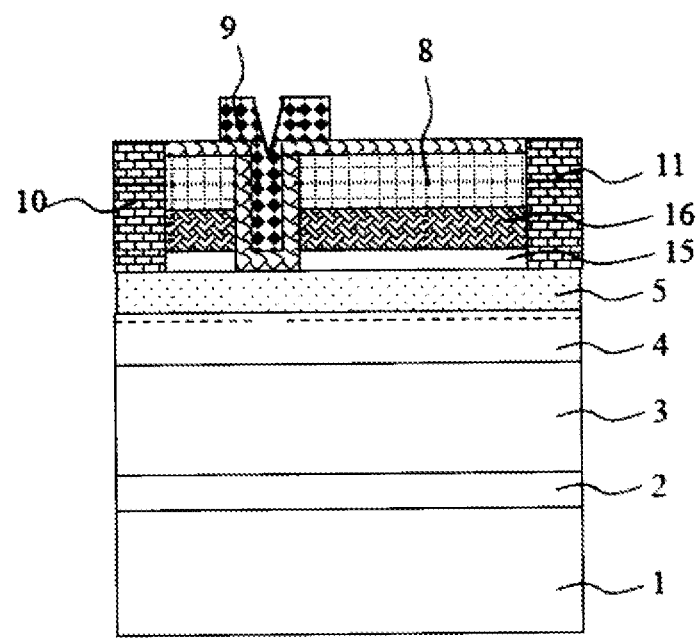

Referring to FIG. 11g, in an eleventh embodiment of the application, an enhancement mode switching device includes: a substrate 1, and a nitride nucleation layer 2, a nitride buffer layer 3, a nitride channel layer 4, a nitride barrier layer 5, a cap layer 15, an aluminum oxide layer 16 (or an aluminum oxynitride layer 16) and a silicon nitride layer 8 which are formed on the substrate 1 in sequence. A groove H11 is arranged in a gate region of the silicon nitride layer 8 (referring to FIG. 11c). A height of the groove H11 is equal to a sum of a thickness of the silicon nitride layer 8, a thickness of the aluminum oxide layer 16 (or the aluminum oxynitride layer 16) and a thickness of the cap layer 15. An additional dielectric layer 14 is formed on an inner wall of the groove H11 and on the silicon nitride layer 8. P-type semiconductor material 9 is formed on a gate region of the additional dielectric layer 14. A source electrode 10 and a drain electrode 11 are arranged at two sides of the gate region, respectively. Each of the source electrode 10 and the drain electrode 11 is through the additional dielectric layer 14, the silicon nitride layer 8, the aluminum oxide layer 16 (or the aluminum oxynitride layer 16) and the cap layer 15, and contacts with the nitride barrier layer 5.

FIG. 11a-FIG. 11g are cross sections illustrating the enhancement mode switching device and a series of processes of a method for fabricating the same according to the eleventh embodiment of the application.

Referring to FIG. 11a, a substrate 1 is provided at first. The substrate 1 may be selected from semiconductor material, ceramic material or macromolecular material, etc. In this embodiment, the substrate 1 is preferably selected from sapphire, silicon carbide, silicon, lithium niobate, silicon-on-insulator substrate (SOI), gallium nitride or aluminum nitride.

A nitride transistor structure is then prepared on the substrate 1. The nitride here is preferably AlInGaN. Specifically, a nitride nucleation layer 2, a nitride buffer layer 3, a nitride channel layer 4, a nitride barrier layer 5 and a cap layer 15 are grown on the substrate 1 in sequence. Here, material of the nitride nucleation layer 2, the nitride buffer layer 3, the nitride channel layer 4 and the nitride barrier layer 5 may be any Group III nitride or any combination of Group III nitrides. In the embodiment, the nitride nucleation layer 2 may be, for example, AlInGaN. The nitride buffer layer 3 may be, for example, AlGaN. The nitride channel layer 4 may be, for example, GaN. The nitride barrier layer 5 may be, for example, AlGaN. The cap layer 15 may be gallium nitride, or may also include aluminum (aluminum gallium nitride), where a compositional ratio of aluminum may be a constant or decrease gradually or increase first and then decrease, or a super lattice structure is formed with a compositional ratio of aluminum varying periodically. In other embodiments, the nitride barrier layer 5 may not be arranged, and in this case, the nitride channel layer 4 is non-doped or n-doped.

A dielectric layer is then grown on the accomplished nitride transistor structure. A gate region is defined on the dielectric layer. Specifically, an aluminum oxide layer 16 (or an aluminum oxynitride layer 16) and a silicon nitride layer 8 are grown on the accomplished nitride transistor structure in sequence. In the embodiment, the dielectric layer may be grown in situ or may be grown by Atomic Layer Deposition (ALD), Chemical Vapor Deposition (CVD), Molecular Beam Epitaxy (MBE), Plasma Enhanced Chemical Vapor Deposition (PECVD) or Low Pressure Chemical Vapor Deposition (LPCVD), or a combination thereof. It should be understood that the methods for forming the dielectric layer described herein are merely for illustration. In the application, the dielectric layer may be formed by any method known to those skilled in the art. In other embodiments, the dielectric layer may also include a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

Referring to FIG. 11b-11c, a groove H11 at least partially through the dielectric layer is formed by etching the gate region of the dielectric layer. In the embodiment, fluorine-based plasma etching, for example, may be adopted in the etching process. Due to selective etching by the fluorine-based plasma etching treatment, the etching process stops when reaching the aluminum oxide layer 16 (or the aluminum oxynitride layer 16). The aluminum oxide layer 16 (or the aluminum oxynitride layer 16) and part or all of the cap layer 15 is etched by wet etching or dry etching, to form the groove H10.

Referring to FIG. 11d, an additional dielectric layer 14 is deposited in the groove H11 formed by etching. Material of the additional dielectric layer 14 may include, for example, $Al_2O_3$ or AlON. The additional dielectric layer 14 may be grown by Atomic Layer Deposition, Chemical Vapor Deposition, Molecular Beam Epitaxy, Plasma Enhanced Chemical Vapor Deposition or Low Pressure Chemical Vapor Deposition, or a combination thereof. It should be understood that the methods for forming the additional dielectric layer described herein are merely for illustration. In the application, the additional dielectric layer may be formed by any method known to those skilled in the art. Material of the additional dielectric layer may also be selected from one or any combination of SiN, SiON, $SiO_2$ and $HfO_2$.

Referring to FIG. 11e, p-type semiconductor material 9 is deposited on the additional dielectric layer 14 in the groove H11 formed by etching. The p-type semiconductor material 9 may be selected from p-type diamond, p-type NiO, p-type GaN, or p-type polycrystalline GaN, etc.

Referring to FIG. 11f, the p-type semiconductor material 9 on the additional dielectric layer 14 except for the gate region is removed. In the embodiment, for example, the p-type semiconductor material 9 is p-type diamond, then the p-type diamond in the gate region is retained, and the p-type diamond in other region may be etched away with plasma. In this case, the p-type semiconductor material 9 is actually the gate of the enhancement mode switching device in the application. Conductivity of the gate can be improved with an additional conductive metal layer.

Referring to FIG. 11g, the nitride transistor structure is exposed by etching the dielectric layer except for the gate region. In the embodiment, the nitride barrier layer 5 may be exposed, for example, by dry etching, or the nitride barrier layer 5 may even be etched through, to form two ohmic contact regions. Finally, a source electrode 10 is formed on one ohmic contact region, and a drain electrode 11 is formed on the other ohmic contact region.

By the aforesaid embodiments, advantages of the enhancement mode switching device fabricated by the method for fabricating the enhancement mode switching device are as follows.

By forming a dielectric layer on a nitride transistor structure, forming a groove structure by locally thinning a gate region of the dielectric layer, and arranging p-type semiconductor material in the groove, an n-type conductive layer below the gate can be pinched off. Therefore, a gallium nitride enhancement mode switching device is achieved with a simple process, and the fabricated device is stable and reliable.

It should be understood that, although the specification is described by the embodiments, it is not indicates that each embodiment includes only one independent technical solution. The way of description is merely for clarity. Those skilled in the art should consider the specification as a whole. Solutions in various embodiments may be combined appropriately to form other embodiments understandable to those skilled in the art.

The series of detailed description listed above are merely detailed description for feasible embodiments of the application, which are not to limit the scope of the application. Any equivalent embodiment or modification without departing from the art and spirit of the application should be contained within the scope of the application.

The invention claimed is:

1. An enhancement mode switching device, comprising:
a substrate;
a nitride transistor structure arranged on the substrate;
a first dielectric layer formed on the nitride transistor structure, wherein a gate region and two ohmic contact regions respectively located at two sides of the gate region are defined on the first dielectric layer, and each of the two ohmic contact regions is through the first dielectric layer;
a groove formed in the gate region;
p-type semiconductor material formed in the groove; and
a source electrode and a drain electrode located at the two ohmic contact regions, wherein, the groove is partially through the first dielectric layer and the p-type semiconductor material directly contacts, at the bottom of the groove, the first dielectric layer which separates the p-type semiconductor material from the nitride transistor structure, or wherein, the groove is completely through the first dielectric layer and does not extend into the nitride transistor structure, and the device comprises further second dielectric layer formed in the groove completely through the first dielectric layer under the p-type semiconductor material.

2. The enhancement mode switching device according to claim 1, wherein the nitride transistor structure comprises:
a nitride nucleation layer located on the substrate;
a nitride buffer layer located on the nitride nucleation layer; and
a nitride channel layer located on the nitride buffer layer.

3. The enhancement mode switching device according to claim 2, wherein the nitride channel layer is non-doped or n-type doped.

4. The enhancement mode switching device according to claim 2, wherein the nitride transistor structure further comprises a nitride barrier layer arranged on the nitride channel layer.

5. The enhancement mode switching device according to claim 4, wherein the nitride transistor structure further comprises a nitride cap layer formed on the nitride barrier layer.

6. The enhancement mode switching device according to claim 5, wherein nitride in the nitride cap layer is gallium nitride or aluminum gallium nitride.

7. The enhancement mode switching device according to claim 1, wherein the first dielectric layer comprises a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

8. The enhancement mode switching device according to claim 1, wherein the p-type semiconductor material is selected from p-type diamond, p-type NiO, p-type GaN or p-type polycrystalline GaN.

9. The enhancement mode switching device according to claim 1, further comprising a conductive metal layer formed on the p-type semiconductor material.

10. The enhancement mode switching device according to claim 1, wherein material of second dielectric layer is selected from one or any combination of $Al_2O_3$, AlON, SiN, SiON, $SiO_2$ and $HfO_2$.

11. A method for fabricating an enhancement mode switching device, comprising steps as follows:
providing a substrate, and forming a nitride transistor structure on the substrate;
forming a first dielectric layer on the nitride transistor structure, wherein a gate region is defined on the first dielectric layer;
forming, in the gate region, a groove extending toward the nitride transistor structure;
forming p-type semiconductor material in the groove;
etching the first dielectric layer except for the gate region in the first dielectric layer to form two ohmic contact regions; and
forming a source electrode and a drain electrode at the two ohmic contact regions, respectively, wherein, the groove is partially through the first dielectric layer and the p-type semiconductor material directly contacts, at the bottom of the groove, the first dielectric layer which separates the p-type semiconductor material from the nitride transistor structure, or wherein, the groove is completely through the first dielectric layer and does not extend into the nitride transistor structure, and the method comprises further forming second dielectric layer in the groove completely through the first dielectric layer, and the step of forming p-type semiconductor material in the groove comprises forming the p-type semiconductor material on the second dielectric layer in the groove completely through the first dielectric layer.

12. The method for fabricating the enhancement mode switching device according to claim 11, further comprising forming a conductive metal layer on the p-type semiconductor material after forming the p-type semiconductor material in the groove.

13. The method for fabricating the enhancement mode switching device according to claim 11, wherein the step of forming the nitride transistor comprises:
forming a nitride nucleation layer on the substrate;
forming a nitride buffer layer on the nitride nucleation layer; and
forming a nitride channel layer on the nitride buffer layer, wherein the nitride channel layer is non-doped or n-type doped; and
forming a nitride barrier layer on the nitride channel layer.

14. The method for fabricating the enhancement mode switching device according to claim 13, further comprising forming a nitride cap layer on the nitride barrier layer, wherein nitride in the nitride cap layer is gallium nitride or aluminum gallium nitride.

15. The method for fabricating the enhancement mode switching device according to claim 11, wherein the first dielectric layer comprises a silicon nitride layer, and/or a silicon dioxide layer, and/or an aluminum nitride layer, and/or an aluminum silicon nitride layer, and/or an aluminum oxide layer, and/or an aluminum oxynitride layer, and/or hafnium oxide, and/or silicon oxynitride, and/or hafnium aluminum oxide.

16. The method for fabricating the enhancement mode switching device according to claim 11, wherein forming the second dielectric layer in the groove comprises performing oxidation treatment on the first dielectric layer.

17. The method for fabricating the enhancement mode switching device according to claim 11, wherein forming the second dielectric layer in the groove comprises depositing the second dielectric layer on an inner wall of the groove.

18. The method for fabricating the enhancement mode switching device according to claim 17, wherein material of the second dielectric layer is selected from one or any combination of $Al_2O_3$, AlON, SiN, SiON, $SiO_2$ and $HfO_2$.

19. The enhancement mode switching device according to claim 1, wherein the groove partially through the first dielectric layer has a height less than a thickness of the first dielectric layer.

20. The method for fabricating the enhancement mode switching device according to claim 11, wherein the groove partially through the first dielectric layer has a height less than a thickness of the first dielectric layer.

* * * * *

UNITED STATES PATENT AND TRADEMARK OFFICE
CERTIFICATE OF CORRECTION

PATENT NO. : 9,812,540 B2
APPLICATION NO. : 14/395338
DATED : November 7, 2017
INVENTOR(S) : Kai Cheng It is certified that error appears in the above-identified patent and that said Letters Patent is hereby corrected as shown below:

In the Specification

Column 16, Line 66, "Referring to FIG 5c," should read --Referring to FIG 8c--

Column 20, Line 15, "Referring to FIG 10e," should read --Referring to FIG 10c--

Column 23, Line 47, "wherein material of second" should read --wherein material of the second--

Signed and Sealed this
Seventeenth Day of April, 2018

Andrei Iancu
*Director of the United States Patent and Trademark Office*